SWITCHING MEANS COMPRISING A THYRISTOR WITH CONTROLLED AND BIAS ELECTRODES

Filed July 1, 1968

Nov. 24, 1970 P. SVEDBERG ET AL 3,543,105

SWITCHING MEANS COMPRISING A THYRISTOR WITH CONTROLLED AND BIAS ELECTRODES

Filed July 1, 1968

2 Sheets-Sheet 2

United States Patent Office 3,543,105
Patented Nov. 24, 1970

3,543,105

SWITCHING MEANS COMPRISING A THYRISTOR WITH CONTROLLED AND BIAS ELECTRODES

Per Svedberg, Vallingby, Bengt-Arne Vedin, Kungsangen, Karl Malen, Stockholm, and Carl Ingvar Boksjö, Karl Erik Olsson, and Erich Spicar, Ludvika, Sweden, assignors to Allmanna Svenska Elektriska Aktiebolaget, Vasteras, Sweden, a corporation of Sweden Filed July 1, 1968, Ser. No. 741,671
Claims priority, application Sweden, June 30, 1967, 9,872/67
Int. Cl. H01l 11/10
U.S. Cl. 317—235 3 Claims

ABSTRACT OF THE DISCLOSURE

A thyristor includes a semi-conducting body with adjacent base and N-emitter layers and an ignition control electrode connected to the base layer. One or more bias electrodes are connected to the base layer and are supplied at least during the blocking interval with negative bias voltage to increase the resistance of the thyristor to *dV/dt*-ignition.

BACKGROUND OF THE INVENTION

Field of the invention

The present invention relates to a switching means comprising a thyristor having a semi-conducting body with base and emitter layers, a control electrode, and an ignition electrode connected to one base layer of the thyristor in order to ignite the thyristor.

The prior art

A thyristor, that is a controlled switching means comprising a semi-conductor body having four layers of alternately opposed conducting types, withstands a certain maximum forward blocking voltage (anode positive in relation to the cathode) during static conditions. If this voltage is exceeded the thyristor ignites, so-called auto-ignition. However, when the forward blocking voltage increases rapidly the thyristor ignites at a lower voltage. This is because a capacitive charging current flows through the middle PN-junction which functions as a capacitor and is reverse biased upon a forward blocking voltage, and this current gives rise to an increased charge carrier injection from the outer layers of the semi-conductor body (the emitter layers) to the middle junction. The occurrence of this type of auto-ignition (*dV/dt*-ignition) limits the range of applications of a thyristor and it is therefore desirable as far as possible to increase the resistance of the thyristor to *dV/dt*-ignition. Conventional thyristors have a control electrode located on one of the middle layers (base layers) of the thyristor and connected to a control device which delivers ignition current to ignite the thyristor. Normally one of the two base layers is relatively high-ohmic and the other, on which the control electrode is located, relatively low-ohmic, the former usually being N-conducting and the latter P-conducting. It is known that the resistance of a thyristor to *dV/dt*-ignition increases if, during the forward blocking interval, the control electrode is given such a bias voltage that the PN-junction situated between the base layer on which the control electrode is located and the adjacent emitter layer becomes biased in the reverse direction.

SUMMARY OF THE INVENTION

The increase in so-called *dV/dt* resistance thus achieved, however, is limited. A considerable improvement in this respect is achieved with a thyristor according to the invention. This is characterized in that at least one additional electrode, bias electrode, is connected to the base layer on which the ignition electrode is located and that a bias voltage source is connected to this electrode and arranged, at least during the forward blocking interval of the thyristor, to supply the bias electrode with such a bias voltage that the PN-junction situated between the base layer and the adjacent emitter layer is biased in the reverse direction.

According to a further development of the invention, several bias electrodes are located on the edge of the base layer, evenly distributed along this. Thus the greatest distance between an arbitrary point on the base layer and the nearest bias electrode can be reduced to a low value, which increases the effectivity of these electrodes.

By locating three equidistant bias electrodes on the edge of the base layer in a thyristor where the semi-conductor body is shaped as a circular disc, said distance will at the most be equal to the radius of the base layer.

In another embodiment six equidistant bias electrodes are located on the edge of the base layer and one at its centre so that said distance will be equal to only approximately half the radius of the base layer, and the *dV/dt*-ignition resistance of the thyristor is further increased.

The same result can easily be achieved according to one embodiment of the invention by providing the base layer with a bias electrode which is in contact with the base layer along at least the main part of its circumference and thus surrounds at least the main part of the emitter layer.

With a thyristor according to the invention the simplest method of connecting the control electrodes to a control device is to connect the electrodes to the control device in parallel with each other, in which case the control device is arranged during the forward blocking interval of the thyristor to deliver bias voltage and during the conducting interval to deliver ignition voltage to the electrodes. If the ignition process started in all the electrodes, this method would have the advantage that the ignition of the thyristor would take place rapidly and its ability during the ignition process to withstand a rapidly increasing load current would be excellent. It has been found, however, that, because of unavoidable differences in the thyristor, ignition will usually commence at only one of the electrodes. Thus there is no improvement in comparison with a thyristor having only one ignition electrode. However, according to one embodiment of the invention, by not connecting any ignition current to the bias electrodes, but only to one or possibly a few ignition electrodes, it is possible to make the ignition process commence at a specific electrode (possibly a few) and the thyristor can then be designed so that the greatest possible ignition resistance is obtained.

The bias electrodes can then be connected to the ignition electrodes by means of one or more diodes which are so directed that bias voltage, but not ignition voltage, is supplied to the bias electrodes. These diodes may be built into the thyristor capsule so that this only needs one lead-in insulator for connection of the control electrodes.

With a thyristor where the bias electrodes are only supplied with bias voltage the control device can be considerably simplified by arranging for the ignition electrode to be supplied only with ignition voltage. The control device is suitably divided into two parts, one which only delivers ignition voltage to the ignition electrode and one which only delivers bias voltage to the bias electrodes. These two parts may then have a particularly simple design.

According to a second embodiment of the invention in which all electrodes are arranged to be supplied with ignition current, the electrodes are divided into two groups. The emitter layer of the thyristor is, near each of the electrodes in the first group, shaped so that the current density of the ignition current at the edge of the emitter layer is considerably lower at the electrodes in this group than at the electrodes in the other group. Thus, the first group consists of those electrodes where ignition is not to take place and the second group of that (possibly those) electrode where the ignition process is to start. Thus also in this embodiment the ignition starts at a specific electrode or electrodes and the thyristor can be designed for high ignition resistance.

According to a further development of this embodiment, the emitter layer near each of the electrodes in the first group is provided with a cut having the form of a notch or hole, the length of the rim of the cut being great in comparison with the dimensions of the contact surface of the electrode with the base layer, and the cut being shaped so that the shortest distance between the rim of the cut and the electrode is constant along at least the main part of the rim. The ignition current will thus be distributed along the rim of the cut and the current density will be so low that the ignition will occur at the electrodes in the second group. The rim of the cut may suitably be shaped as at least a part of a circular arc with its center within the electrode.

According to another modification of this embodiment, the base layer between each of the electrodes in the first group and the emitter layer is thinner than between the emitter layer and the electrodes in the second group. This is suitably carried out by making the base layer near the bias electrodes thinner by etching or blasting. By a suitable choice of the decrease in thickness the current density of the ignition current at the edge of the emitter layer can be reduced so much near the bias electrodes that ignition only occurs at the ignition electrode (ignition electrodes).

BRIEF DESCRIPTION OF THE DRAWINGS

The invention will be described in more detail with reference to the accompanying drawings.

In FIG. 1, on a support plate 1 of metal is the semi-conductor body itself which comprises the alternately P and N conducting layers 2–5. On the N-emitter layer 5 is the cathode contact 6 to which the cathode conductor 7 is connected. On the P-base layer, 4, which is the most low-ohmic of the two base layers, is the control electrode 9. With the help of the schematically shown control device (the voltage source 10 and the switch 11) a positive voltage in relation to the cathode can be delivered to the control electrode to ignite the thyristor. This is connected in series with the load resistor 14 to the voltage source 15.

DESCRIPTION OF THE PREFERRED EMBODIMENTS

Figure 1:
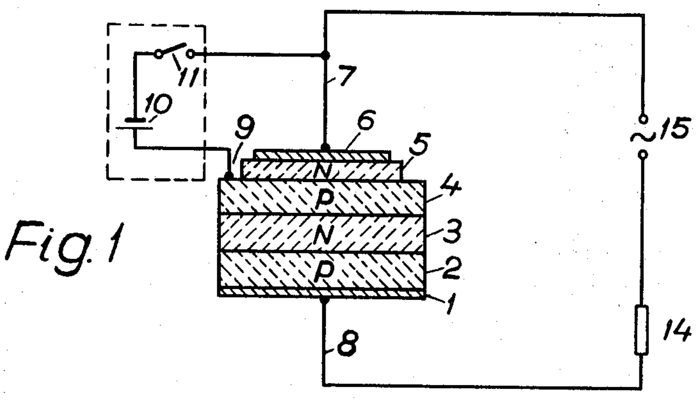
FIG. 1 shows a thyristor of conventional type, seen in cross-section.
Figure 2:
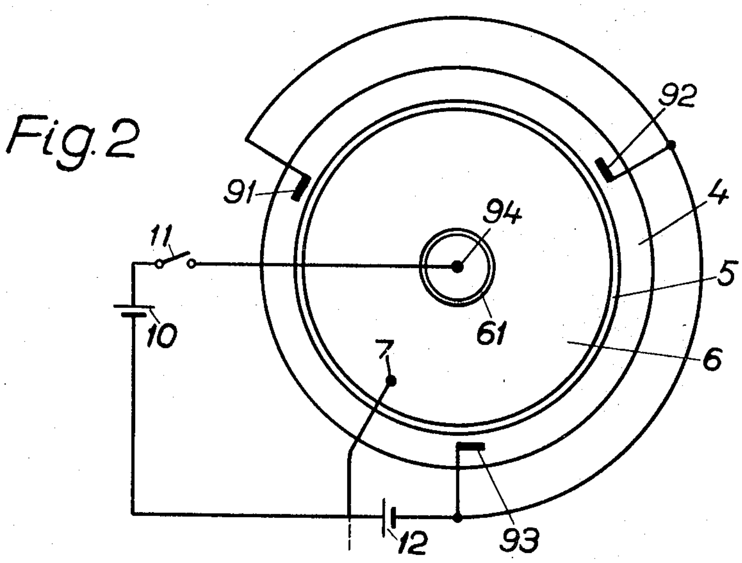
FIG. 2 shows a thyristor according to the invention, seen from the cathode side.

FIG. 2 shows a thyristor according to the invention, in which cathode contact 6 and N-emitter layer 5 are provided with a notch or hole 61 through which the control electrode 94 (ignition electrode) is inserted and connected to the P-base layer 4. Between this electrode and the cathode connection 7 the control device (10, 11) is connected. Three bias electrodes 91–93 are located on the rim of the P-base layer 4 and connected to the bias voltage source 12 which gives these electrodes a negative bias voltage in relation to the cathode. The resistance of the thyristor to *dV/dt*-ignition is thus considerably increased in comparison with previously known thyristors. A suitable value for the bias voltage has proved to be of the order of a few volts to some tens of volts, depending on the size of the thyristor, the resistivity and thickness of the semi-conductor body (mainly that of the P-base layer), and other factors. In a typical power thyristor a negative bias voltage of about 10 v. and a total (negative) control current of about 100 ma. through the three bias electrodes proved to be suitable values. The lateral resistance of the P-base layer, measured for example between two of the bias electrodes connected together and the third bias electrode, has considerable influence on the favourable effect of the bias electrodes and should be kept relatively low. In the example mentioned above it was found that the resistance of the layer, measured in the manner indicated, should not be greater than about 1 kilo ohm. The bias voltage source 12 may, without inconvenience, be continuously connected to the bias electrodes and may thus be extremely simple. In this embodiment the power sources for ignition and bias voltage may be chosen independently which is a great advantage for example with series-connected thyristors.

Figure 3:
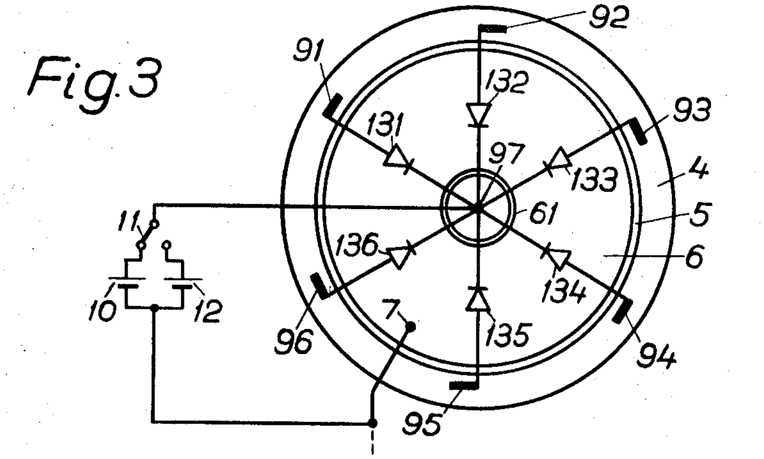
FIGS. 3 to 5 show modifications of the thyristor of FIG. 2.

The thyristor in FIG. 3 (shown from the cathode side) has seven control electrodes located on the P-base layer 4, six (91–96) on the rim of the base layer and one (97) at its centre. The latter is inserted to the base layer through the opening 61 in the cathode contact 6 and the N-emitter layer 5. The six control electrodes positioned on the rim are connected to the central control electrode by means of the diodes 131–136. Between the central control electrode and the cathode connection 7 the control device (10, 11, 12) is connected. With the switch 11 in the position shown the control device delivers positive voltage (ignition voltage) to the electrode 97, the ignition electrode, and the diodes prevent this voltage from being supplied to the electrodes 91–96, the bias electrodes. With the switch 11 in its other position all the control electrodes are supplied with negative bias voltage and since no point on the thyristor is further from any control electrode than approximately half the radius of the base layer, the electrodes are particularly effective in preventing *dV/dt*-ignitions. An advantage with this embodiment is that the diodes can suitably be located inside the thyristor capsule and it is then necessary to use only one lead in insulator through the capsule for the supply of both ignition and bias voltage.

Figure 4:
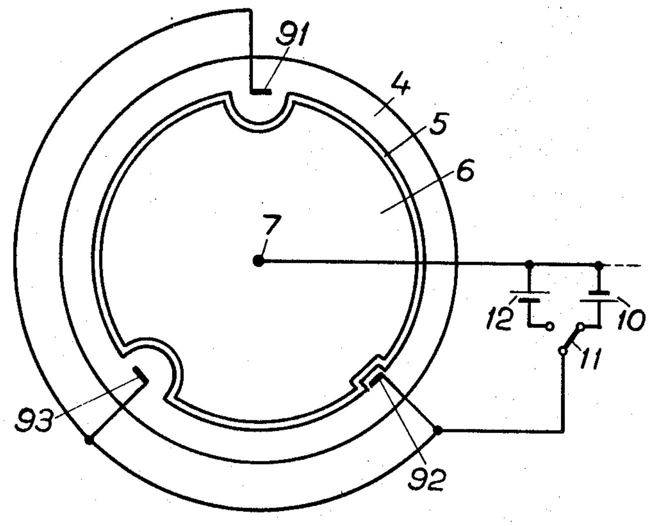

FIG. 4 shows a thyristor having three control electrodes (91, 92, 93) connected to the control device (10, 11, 12) and located on the rim of the P-base layer. As described previously the control device may deliver either ignition or bias voltage. As mentioned above it is desirable that the thyristor always ignites at the same point so that this point can then be designed for the greatest possible ignition resistance. The edge of the emitter layer 5 is thus provided near the electrodes 91 and 93 with semi-circular notches. These are of such a size that the length of the rim of a notch is great in comparison with the length of the contact surface of the control electrode with the base layer. A notch is also made in the emitter layer near the electrode 92. This notch is considerably smaller, the length of its rim being approximately equal to the length of the contact surface of the control electrode with the base layer. When the control device delivers ignition voltage to the control electrodes, an ignition current will flow from each of these through the base layer to the rim of the emitter layer. Near the electrodes 91 and 93 the ignition current density at the rim of the emitter layer will be much less than near the electrode 92, with the result that the ignition process will always be initiated at this electrode. This presumes, however, that the entire rim of the notches near the electrodes 91 and 93 is at substantially the same distance from the respective control electrodes so that the ignition current is distributed evenly along the rim. This method may of course also be used with a centrally positioned control electrode.

Figure 5:
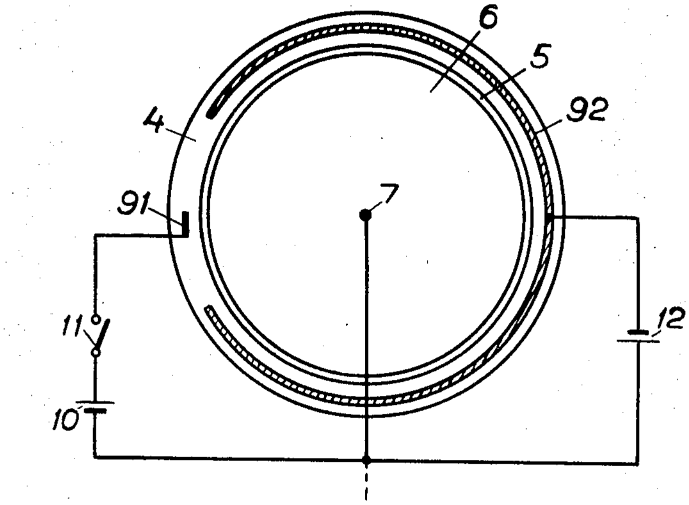

FIG. 5 shows a thyristor according to the invention provided with an ignition electrode 91 and a bias electrode 92. The latter is designed to make contact with the base-layer 4 along the greater part of the circumference of the base layer and thus has considerable influence in preventing *dV/dt* ignition. As with the thyristor according to FIG. 2 the control and bias electrodes are connected to separate voltage sources. Of course it is also possible, as with the thyristor according to FIG. 4, to connect the electrodes to the same voltage source (control device). In order to ensure that ignition occurs at the ignition electrode 91, therefore, the base layer 4 is suitably made thinner (by means of etching or blasting) between the edge of the emitter and the bias electrode 92 than between the emitter and the ignition electrode 91.

The thyristors shown and described are only examples and a considerable number of other embodiments are feasible within the scope of the invention.

We claim:

1. Switching means comprising a thyristor having a semi-conducting body with adjacent base and emitter layers, a plurality of electrodes including an ignition control bias electrode connected to the base layer of the thyristor and having means connected to the ignition control electrode to supply ignition current thereto in order to ignite the thyristor, and at least one additional bias electrode connected to the base layer, and means operable, at least during the blocking interval of the thyristor, to supply the bias electrodes with a bias voltage whereby the PN-junction between the base layer and the adjacent emitter layer is biased in the reverse direction, said ignition current supply means supplying all said bias electrodes with ignition current, the bias electrodes being divided into two groups each comprising at least one electrode and the emitter layer of the thyristor which is situated close to said base layer adjacent each of the electrodes in the first group being provided with a cut having the form of a recess, the length of the rim of the cut being great in comparison with the dimensions of the contact surface of the corresponding bias electrode with the base layer, and the cut being shaped so that the shortest distance between the rim of the cut and the bias electrode is constant along at least the main part of the rim.

2. Switching means according to claim 1, in which the rim of the cut is shaped as at least a part of a circular arc with its center within the electrode.

3. Switching means according to claim 1, in which the portion of the base layer between each of the electrodes in the first group and the emitter layer is thinner than the portion of the base layer between the emitter layer and the electrodes in the second group.

References Cited

UNITED STATES PATENTS

| | | | |
|---|---|---|---|
| 3,210,563 | 10/1965 | New | 317—235 |
| 3,271,587 | 9/1966 | Schreiner | 317—235 |
| 3,381,186 | 4/1968 | Arends | 317—235 |

OTHER REFERENCES

G.E. Silicon Controlled Rectifier Manual "3.7.5 Rate of Rise of Forward Voltage," pp. 25–27, April 1965.

JERRY D. CRAIG, Primary Examiner

U.S. Cl. X.R.

307—305